(12) United States Patent
Felder et al.

(10) Patent No.: US 7,301,492 B2
(45) Date of Patent: Nov. 27, 2007

(54) CONTROLLED SAMPLING MODULE AND METHOD FOR USE THEREWITH

(75) Inventors: Matthew D. Felder, Austin, TX (US); Michael R. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 11/498,204

(22) Filed: Aug. 1, 2006

(65) Prior Publication Data

US 2007/0069939 A1    Mar. 29, 2007

Related U.S. Application Data

(62) Division of application No. 11/237,340, filed on Sep. 28, 2005, now Pat. No. 7,106,241.

(51) Int. Cl.
*H03M 1/12*    (2006.01)

(52) U.S. Cl. .................................. 341/172; 341/155

(58) Field of Classification Search ................ 341/172, 341/155, 143, 163, 122, 161
See application file for complete search history.

(56) References Cited

U.S. PATENT DOCUMENTS 7,091,896 B2 *    8/2006    Oprescu ...................... 341/155

\* cited by examiner

*Primary Examiner*—Rexford Barnie
*Assistant Examiner*—Joseph Lauture
(74) *Attorney, Agent, or Firm*—Garlick Harrison & Markison; Bruce E. Stuckman

(57) ABSTRACT

A controlled sampling module samples an input signal from an input device and a reference signal. The controlled sampling module includes a plurality of sample capacitors, a switching network, and a switch control module for controlling the switching network. The switching network couples a first capacitor of the plurality of capacitors to the reference signal during a first phase, and to the input signal during a second phase, such that a charge on the first capacitor remaining at an end of the first phase is cancelled during the second phase.

35 Claims, 14 Drawing Sheets

US 7,301,492 B2

CONTROLLED SAMPLING MODULE AND METHOD FOR USE THEREWITH

CROSS REFERENCE TO RELATED PATENTS

The present application is related to the following commonly assigned patent applications, CONTROLLABLE PHASE LOCKED LOOP AND METHOD FOR PRODUCING AN OUTPUT OSCILLATION FOR USE THEREWITH, and PROGRAMMABLE SAMPLE RATE ANALOG TO DIGITAL CONVERTER AND METHOD FOR USE THEREWITH, the disclosures of which are incorporated herein by reference hereto.

The present application is a division of U.S. patent application Ser. No. 11/237,340, entitled, CONTROLLED SAMPLING MODULE AND METHOD FOR USE THEREWITH, filed on Sep. 28, 2005 now U.S. Pat. No. 7,106,241.

TECHNICAL FIELD OF THE INVENTION

The present invention relates to controlled sample modules as may be used in analog to digital converters, and related methods.

DESCRIPTION OF THE RELATED ART

Many devices for sampling an analog input signal are known in the art. FIG. 1 presents a schematic representation of a prior art sampling module. Switches 110 and 112 alternatively couple an input signal, $V_I$, the positive components of a differential reference signal $V_{REFP}$, and the negative component of the differential reference signal $V_{REFN}$, to two sample capacitors 102 and 104. Switches 106 and 108 serve to alternatively couple the opposing end of capacitors 102 and 104 to ground, in a sampling mode, and to amplifier 122 in a dump mode. Amplifier 122 includes a feedback capacitor 120 that, taken together with the switched sampling capacitors 102 and 104 forms an integrator circuit.

In operation, the position of switches are controlled with common non-overlapped clock signals $\phi_1$, $\phi_2$ and control signal D, as known to one of ordinary skill in the art, so as to provide a correlated double sampling of the input signal and the differential reference signal. This circuit 100 may be used in an analog to digital converter (ADC) circuit, such as a sigma-delta modulator. In this embodiment D is the digital output of a 1 bit digital to analog converter embedded inside the sigma-delta ADC. Each sample capacitor 102 and 104 is used for sampling both the input signal and the reference signal. Circuit 100 has many advantages compared to circuits that sample the input and the reference voltage with different capacitors including improved noise characteristics, gain matching of the input to the reference and reduced circuit area, when implemented in an integrated circuit.

The reuse of sample capacitors 102 and 104 for sampling the input signal and the reference signal creates some disadvantages. In particular, circuit 100 creates an increased load on the input device that supplies the input signal. When each sample capacitor samples either the positive or negative component of the reference signal, that resulting charge remains on the capacitor during the next sampling of the input signal. This remaining charge creates a nonlinear load on the input device, and, in particular requires the input device to have a greater slew current in order to drive circuit 100 with acceptable distortion.

The need exists for a sampling circuit that can be implemented efficiently on an integrated circuit, and that reduces the load requirements of the input device that drives the circuit.

DETAILED DESCRIPTION OF THE INVENTION INCLUDING THE PRESENTLY PREFERRED EMBODIMENTS

The embodiments of the present invention yield several advantages over the prior art. The present invention details an implementation for an efficient controlled sampling module for sampling an input signal and a reference signal. The charge on at least one capacitor that remains from sampling the reference signal is cancelled during the sampling of the input signal. This reduces the loading on the input device and further allows the input device to operate with a lower slew current. This controlled sampling module may be implemented in an analog to digital converter, such as a sigma-delta modulator, that is used in a radio receiver front end.

Figure 2:
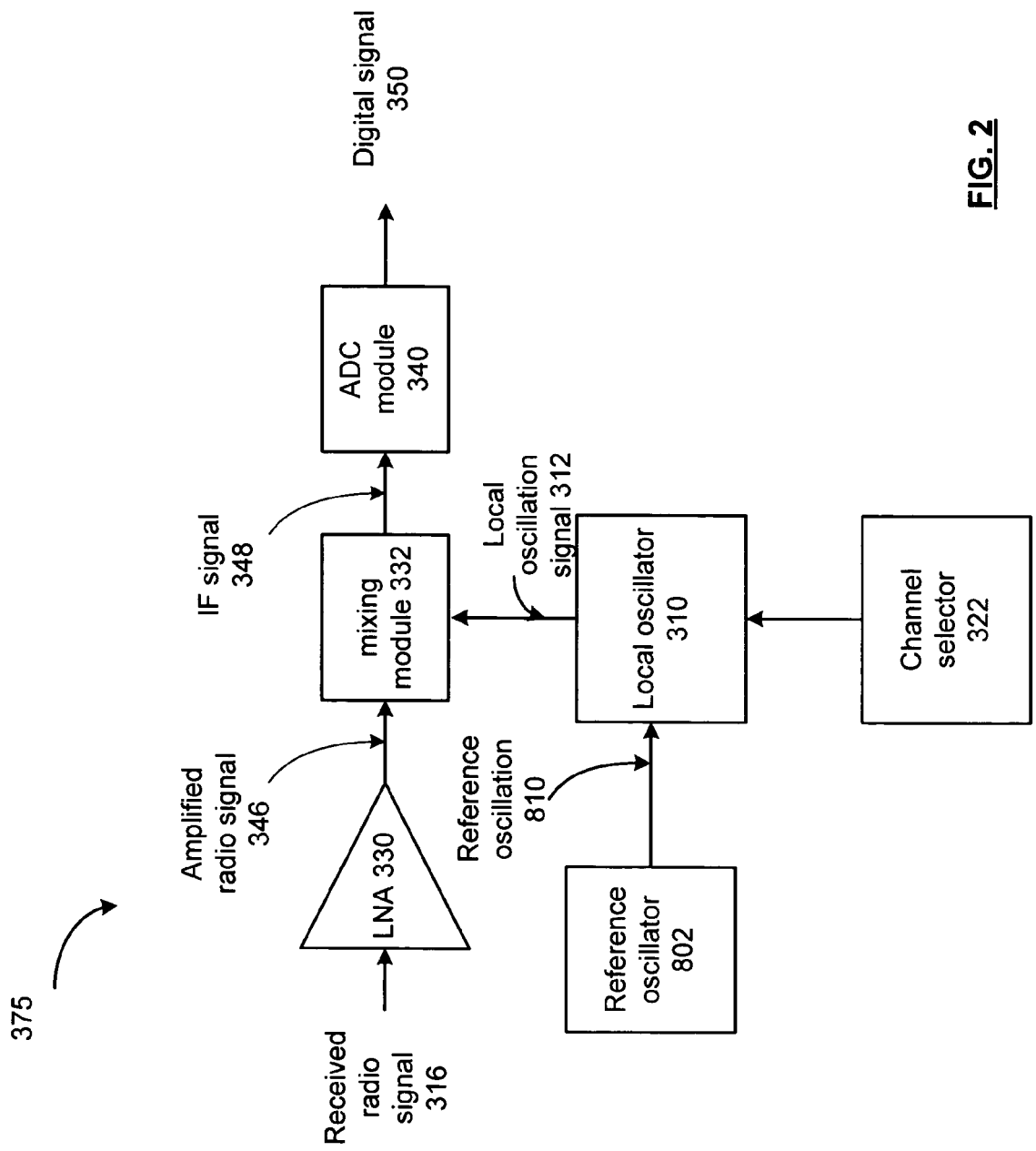
FIG. 2 presents a combination block diagram and schematic diagram of a radio receiver front end in accordance with an embodiment of the present invention.

FIG. 2 presents a combination block diagram and schematic diagram of a radio receiver front end in accordance with an embodiment of the present invention. In particular, the controlled sampling module in accordance with the present invention is included in an ADC module that converts a mixed signal 348 into a digital signal 350. Radio receiver front end 375 receives a received radio signal 316 having a plurality of channel signals, each of the plurality of channel signals being modulated at one of a corresponding plurality of carrier frequencies. Reference oscillator 802 produces a reference oscillation 810 that is transformed by local oscillator 310 into a local oscillation signal 312 at a local oscillation frequency. A channel selector 322 produces control signal that selects the local oscillation frequency for local oscillator 310 corresponding to a selection of one of the plurality of channels. In an embodiment of the present invention, local oscillator 310 includes a phase locked loop circuit for producing a selected local oscillation frequency based on the selected one of the plurality of channels.

Low noise amplifier 330 produces a amplified radio signal 346 that is mixed with the local oscillation signal 312 by mixing module 332 to form mixed signal 348 at an intermediate frequency. In a preferred embodiment of the present invention, the gain at which the low noise amplifier 330 amplifies the receive signal 316 is dependent on the magnitude of the received radio signal 316 and an automatic gain control circuit. Note that mixed signal 348 is a modulated signal and if the local oscillation signal 312 has a frequency that matches the frequency of the selected channel, the mixed signal 348 will have a carrier frequency of approximately zero. If the local oscillation 312 has a frequency that is not equal to the carrier frequency of radio signal 346, then the mixed signal 348 will have a carrier frequency based on the difference between the carrier frequency of the selected channel and the frequency of local oscillation 312. In such a situation, the carrier frequency of the mixed signal 348 may range from 0 hertz to one megahertz or more.

Figure 3:
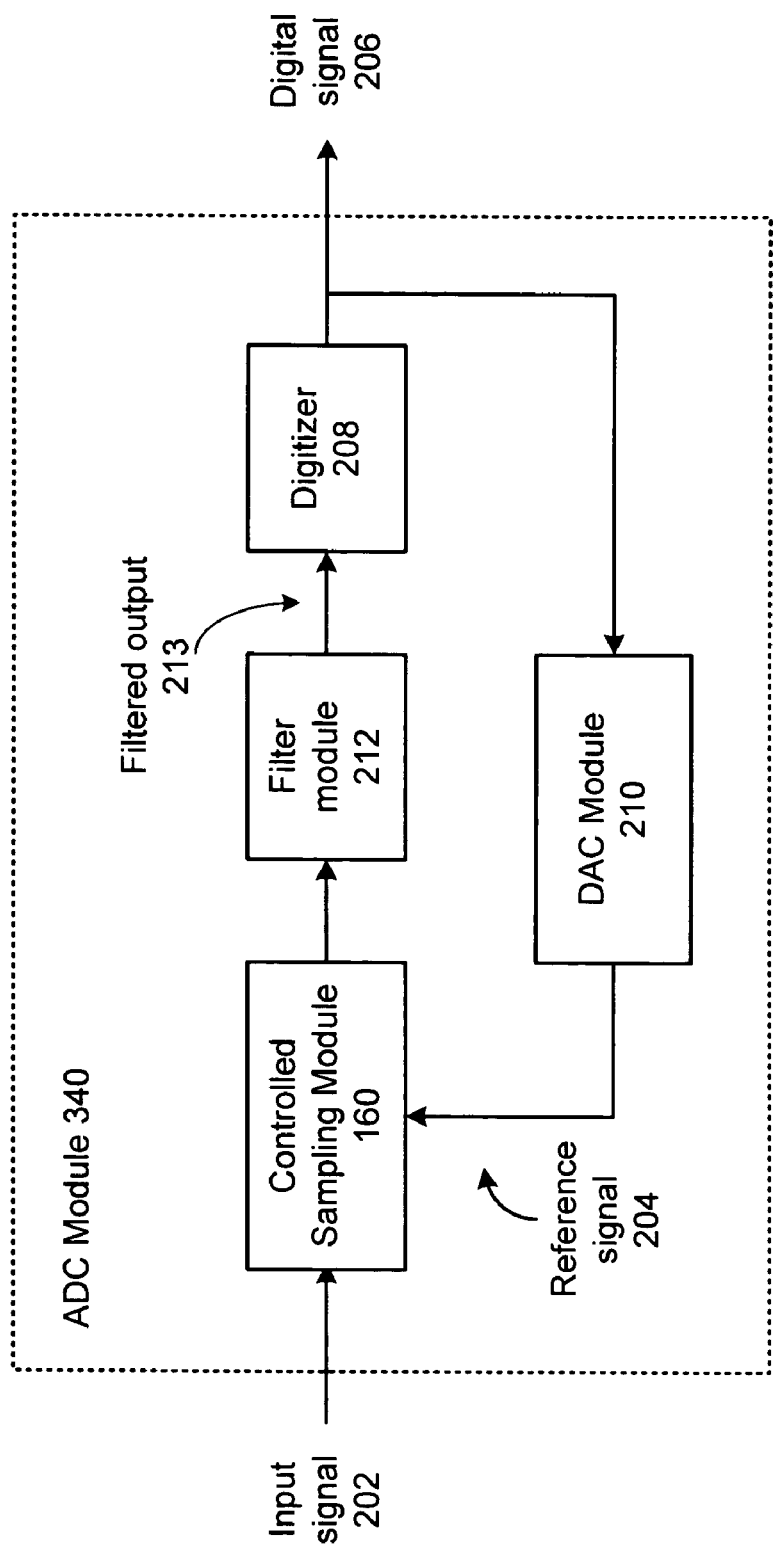
FIG. 3 presents a combination block diagram representation of an ADC module in accordance with an embodiment of the present invention.

FIG. 3 presents a combination block diagram representation of an ADC module in accordance with an embodiment of the present invention. In particular, ADC module 340 is implemented using a sigma-delta modulator. Input signal 202, such as mixed signal 348 is fed to the controlled sampling module 160. The controlled sampling module 160 generates an output signal that is an integrated difference between input signal 202 and reference signal 204 formed by reconstructing an analog version of digital signal 206 produced by digital to analog converter (DAC) module 210. The output of controlled sampling module 160 is filtered by filter module 212 to produce a filtered output 213 that is digitized by digitizer 208 to produce digital signal 206.

In operation, the sigma-delta converter operates at a relatively high variable clock frequency in order to oversample the input signal 202. This over-sampling spreads the quantization noise produced by the ADC module 340 over a wide frequency bandwidth. The high frequency quantization noise can be filtered by the programmable decimation filter that follows. The result is a high precision voltage measurement for accurate processing of input signal 202.

While ADC module 340 has been described in terms of a single stage sigma-delta modulator, other ADC configurations including multi-stage sigma-delta modulators, a multi-stage noise shaping (MASH) architecture, flash converters and other analog to digital converter methods, with or without significant over-sampling, could likewise be used in alternative embodiments of the present invention.

Figure 4:
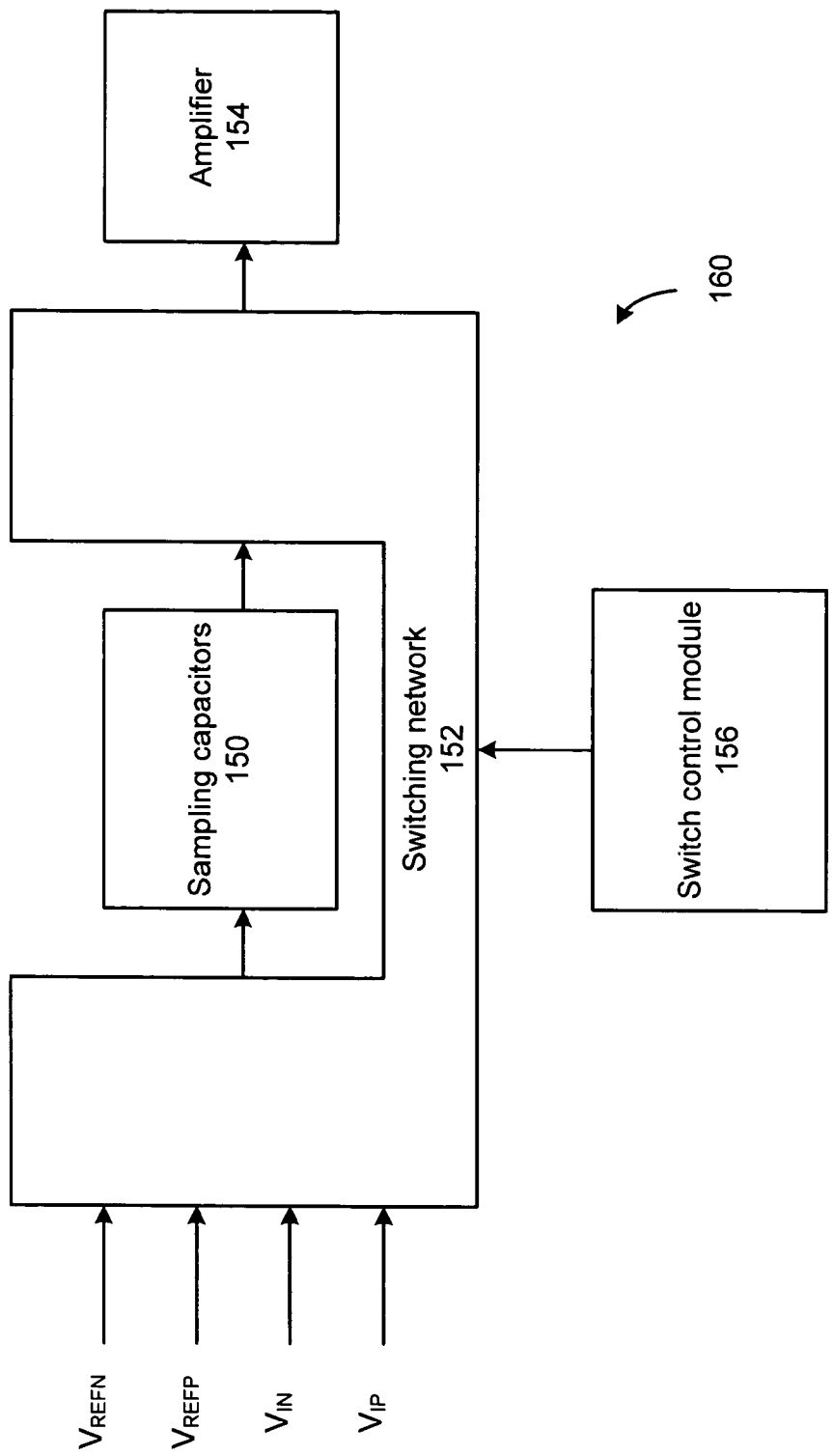
FIG. 4 presents a block diagram representation of a controlled sampling module in accordance with an embodiment of the present invention.

FIG. 4 presents a block diagram representation of a controlled sampling module in accordance with an embodiment of the present invention. In particular, a controlled sampling module 160 is shown for sampling an input signal and a reference signal. In an embodiment of the present invention, the input signal is a discrete time signal. However, in other embodiments of the present invention, the input signal is a continuous time analog signal. The controlled sampling module 160 includes a plurality of sample capacitors 150, and a switching network 152, operably coupled to the plurality of sample capacitors, to the input signal, and to the reference signal. A switch control module 156 is operably coupled to the switching network 152, for controlling the switching network 152, wherein the switching network 152 couples a first capacitor of the plurality of capacitors 150 to the reference signal during a first phase, and to the input signal during a second phase, and wherein a charge on the first capacitor remaining at an end of the first phase is cancelled during the second phase. This serves to minimize the worst-case slew current on the input device that provides the input signal to the controlled sampling module 160. The controlled sampling module 160 further includes an amplifier operably coupled to the switching network. Further operational details of the invention, and a particular circuit implementation, will be described in conjunction with the figures that follow.

Figure 5:
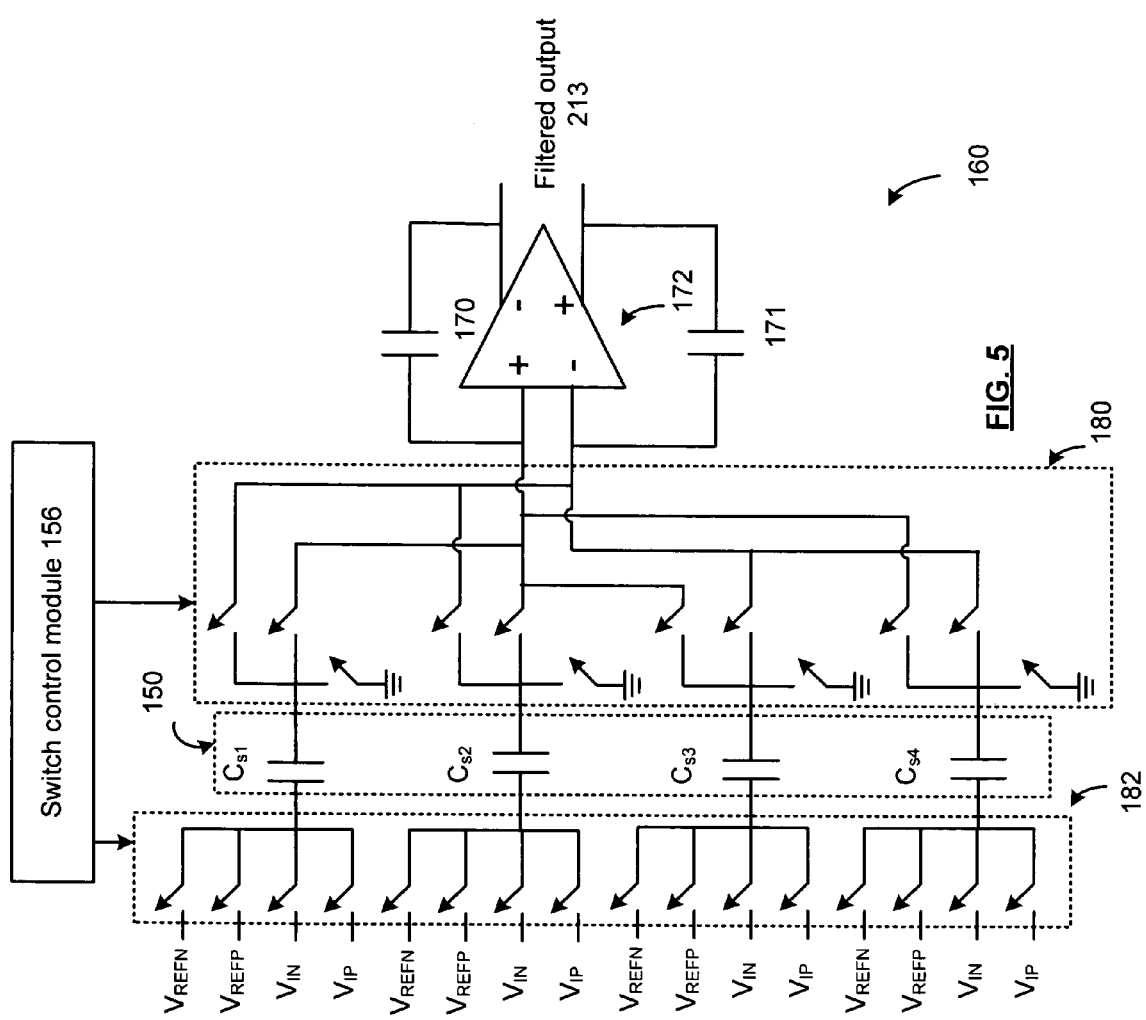
FIG. 5 presents a schematic diagram of a controlled sampling module in accordance with an embodiment of the present invention.

FIG. 5 presents a combination block diagram and schematic diagram of a controlled sampling module in accordance with an embodiment of the present invention. In particular, a schematic diagram of controlled sampling module 160 is presented. In this embodiment, switching network 152 includes the sixteen input switches 182 and the twelve output switches 180. The plurality of sample capacitors 150 includes the four capacitors $C_{s1}$, $C_{s2}$, $C_{s3}$, and $C_{s4}$, and amplifier 154 includes amplifier 172 that is connected in a differential mode with two feedback capacitors, 170 and 171. Amplifier 172, in conjunction with the sample capacitors 150 and the feedback capacitors 170 and 171 comprise an integrator module. In an embodiment of the present invention, this integrator module performs the function of filter module 212 to produce filtered output 213. In an embodiment of the present invention, the capacitance of $(C_{s1}+C_{s2})$ is equal to the capacitance of capacitor 102 from the prior art FIG. 1. In addition, the nominal capacitance values are equal, $C_{s1}=C_{s2}=C_{s3}=C_{s4}$.

The switch control module 156 provides a control signal to each of the input switches 182 and output switches 180 to selectively couple the plurality of sample capacitors 150 to alternatively sample the input signal and the reference signal, and to dump the samples to the amplifier 172. In operation, the switch control module 156 controls the switching network 152 to couple a first capacitor of the plurality of capacitors 150 to the reference signal during a first phase, and to the input signal during a second phase, wherein a charge on the first capacitor remaining at an end of the first phase is cancelled during the second phase.

In an embodiment of the present invention, the switch control module 156 is implemented with a state machine that generates a plurality of clock signals based on at least one system clock. In other embodiments of the present invention, other digital or analog circuits, processors, hardware software or firmware could likewise be used in accordance with the broad scope of the present invention. The operation of each of the input switches 182 and each of the output switches 180 is thereby controlled by the plurality of clock signals so as to provide the operation of the controlled sample module 160 as will be described in greater detail in the following FIGS. 6-9. In particular, FIGS. 6-9 will present the operation of controlled sample module 160 through four phases of operation.

Figure 6:
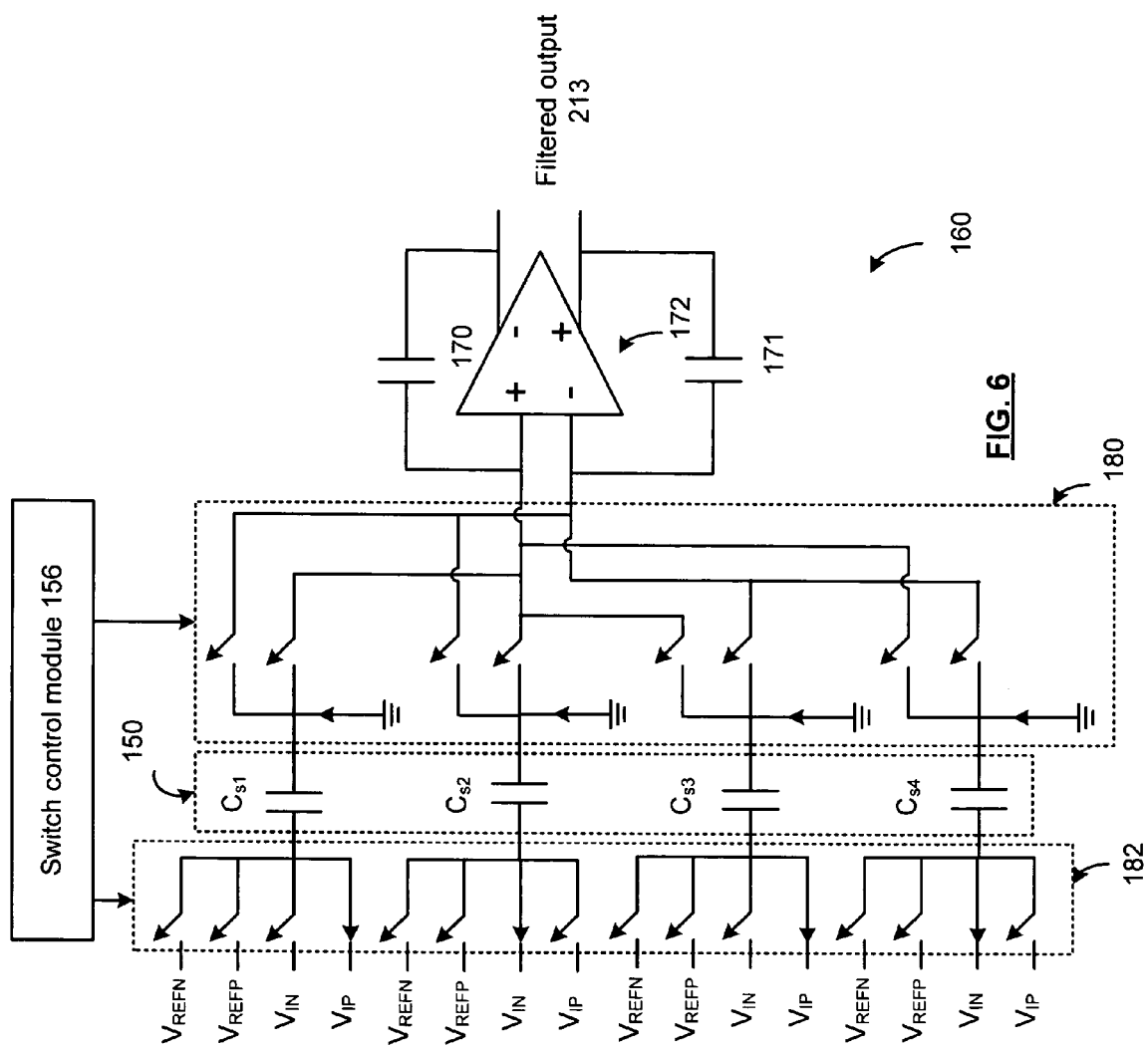
FIG. 6 presents a combination block diagram and schematic diagram representation of a first phase of operation of a controlled sample module in accordance with the present invention.

FIG. 6 presents a combination block diagram and schematic diagram representation of a first phase of operation of a controlled sample module in accordance with the present invention. In particular, this phase of operation implements a first sample phase where the switch control module 156 establishes a first sample configuration of the switching network 152. A first plurality of sample capacitors, $C_{s1}$, and $C_{s3}$, sample the positive component of the input signal, and the second plurality of capacitors, $C_{s2}$, and $C_{s4}$, sample the negative component of the input signal.

In particular, during the first sample phase, the switch control module 156 configures the switching network 152, including input switches 182 and output switches 180 to couple the a first end of the first capacitor $C_{s1}$ to the positive component of the input signal and a second end of the first capacitor $C_{s1}$ to the ground reference signal, to couple a first end of the third capacitor $C_{s3}$ to the positive component of the input signal and a second end of the third capacitor $C_{s3}$ to the ground reference signal, to couple a first end of the second capacitor $C_{s2}$ to the negative component of the input signal and a second end of the second capacitor $C_{s2}$ to the ground reference signal, and to couple a first end of the fourth capacitor $C_{s4}$ to the negative component of the input signal and a second end of the fourth capacitor $C_{s2}$ to the ground reference signal. While the ground reference signal is shown as earth ground in the schematic, other ground configurations that include virtual grounding connections can likewise be employed within the broad scope of the present invention.

Figure 7:
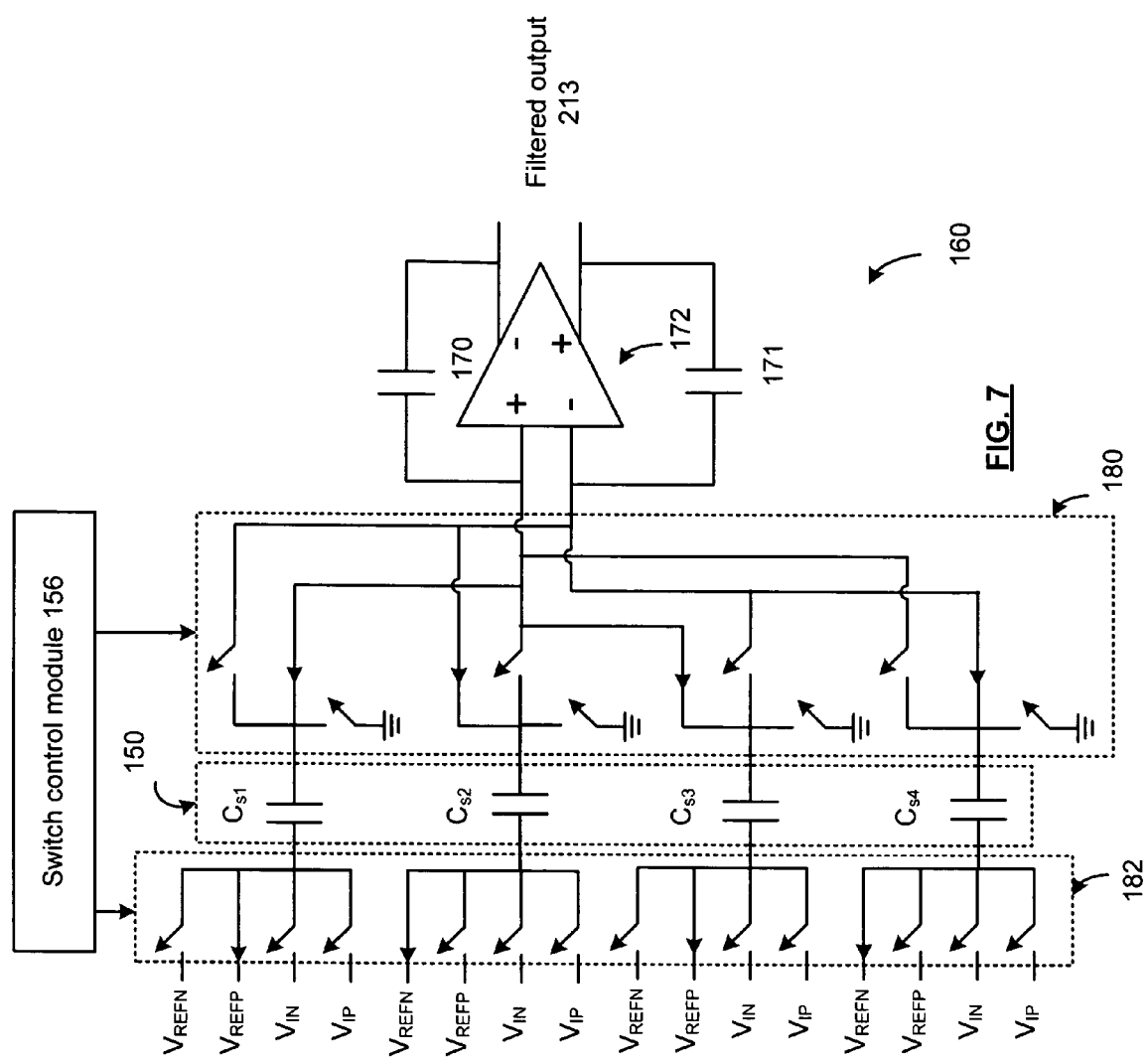
FIG. 7 presents a combination block diagram and schematic diagram representation of a second phase of operation of a controlled sample module in accordance with the present invention.

FIG. 7 presents a combination block diagram and schematic diagram representation of a second phase of operation of a controlled sample module in accordance with the present invention. This phase of operation implements a first integrate phase where the switch control module 156 establishes a first integrate configuration of the switching network 152. The first plurality of sample capacitors, $C_{s1}$, and $C_{s3}$ sample the positive component of the reference signal and are coupled to the amplifier. The second plurality of capacitors, $C_{s2}$, and $C_{s4}$, sample the negative component of the reference signal and are coupled to the amplifier.

In particular, during this first integrate phase, the switch control module 156 configures the switching network 152 to couple the first end of the first capacitor $C_{s1}$ to the positive component of the reference signal and the second end of the first capacitor $C_{s1}$ to the amplifier 172, to couple the first end of the third capacitor $C_{s3}$ to the positive component of the reference signal and the second end of the third capacitor $C_{s3}$ to the amplifier 172, to couple the first end of the second capacitor $C_{s2}$ to the negative component of the reference signal and the second end of the second capacitor $C_{s2}$ to the amplifier 172, and to couple the first end of the fourth capacitor $C_{s4}$ to the negative component of the reference signal and the second end of the fourth capacitor $C_{s4}$ to the amplifier 172. In this fashion, a sampled difference between the input signal and the reference signal is coupled to the amplifier 172 for completion of the integration of the difference in the sample values.

Figure 8:
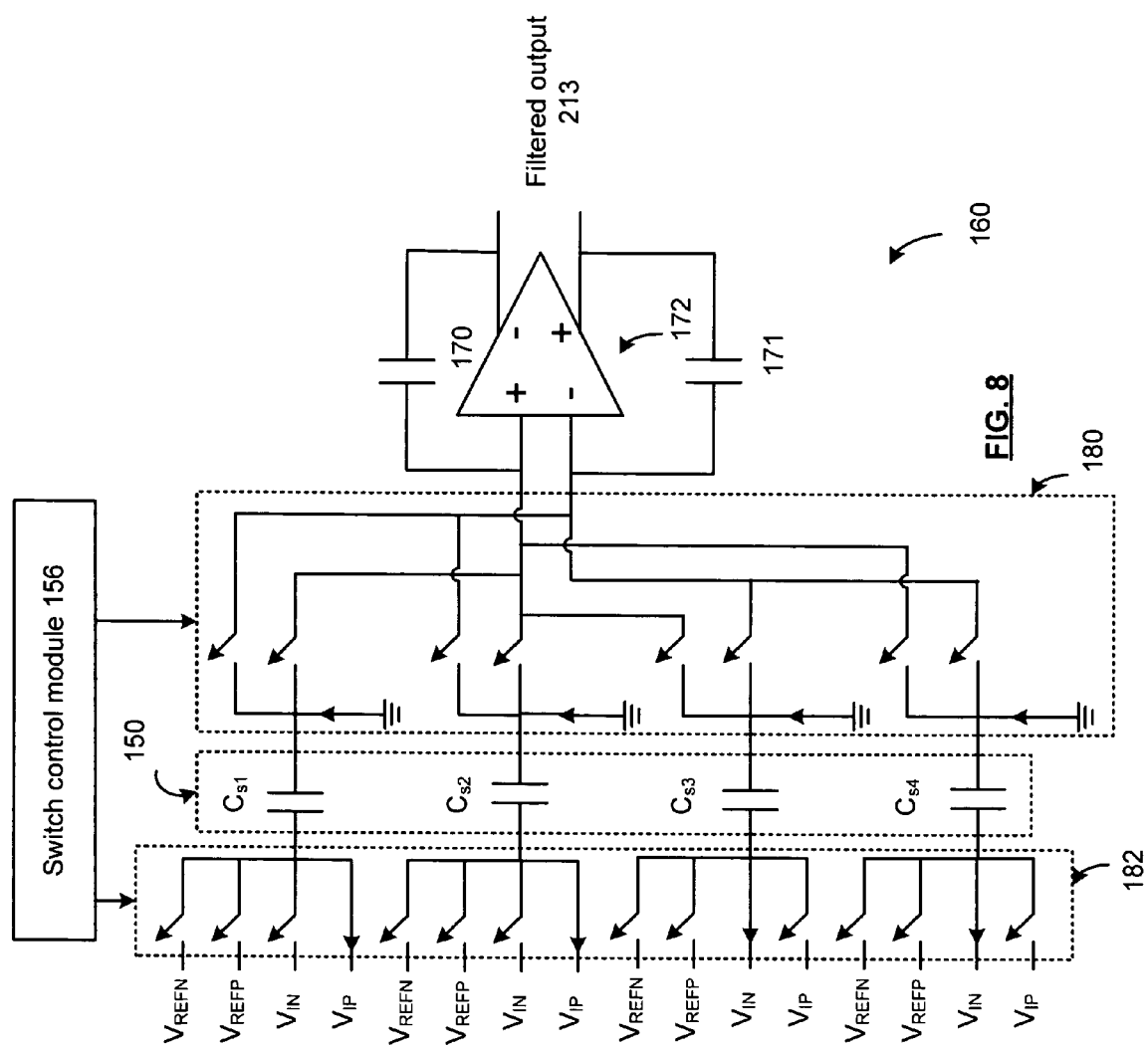
FIG. 8 presents a combination block diagram and schematic diagram representation of a third phase of operation of a controlled sample module in accordance with the present invention.

FIG. 8 presents a combination block diagram and schematic diagram representation of a third phase of operation of a controlled sample module in accordance with the present invention. In this phase, a second sample phase is implemented whereby the switch control module 156 establishes a second sample configuration of the switching network 152. In this configuration, at least one capacitor from the first plurality of sample capacitors and a configuration of at least one capacitor from the second plurality of sample capacitors are interchanged, as compared with the first sample configuration. The effect of this swapping is to cancel the charge, remaining at an end of the first integrate phase of at least one capacitor of the plurality of capacitors.

In particular, the switch control module 156 configures the switching network 152 to couple the first end of the first capacitor $C_{s1}$ to the positive component of the input signal and the second end of the first capacitor $C_{s1}$ to the ground reference signal, to couple the first end of the second capacitor $C_{s2}$ to the positive component of the input signal and the second end of the second capacitor $C_{s2}$ to the ground reference signal, to couple the first end of the third capacitor $C_{s3}$ to the negative component of the input signal and the second end of the third capacitor $C_{s3}$ to the ground reference signal, and to couple the first end of the fourth capacitor $C_{s4}$ to the negative component of the input signal and the second end of the fourth capacitor $C_{s4}$ to the ground reference signal.

In the embodiment shown, the configuration of the second capacitor $C_{s2}$ is swapped with the configuration of the third capacitor $C_{s3}$. The charge remaining on the first capacitor $C_{s1}$ is equal and opposite to the charge remaining on the second capacitor $C_{s2}$, at the end of the second phase of operation since in this prior phase, these two capacitors where coupled, respectively, to the positive and negative component of the reference signal. Likewise the charge remaining on the third capacitor $C_{s3}$ is equal and opposite to the charge remaining on the fourth capacitor $C_{s4}$. As these capacitors are coupled together at the beginning of the second sample phase, these charges cancel one another. This minimizes the worst-case slew current on the input device, such as mixing module 332, that drives controlled sample module 160.

Figure 9:
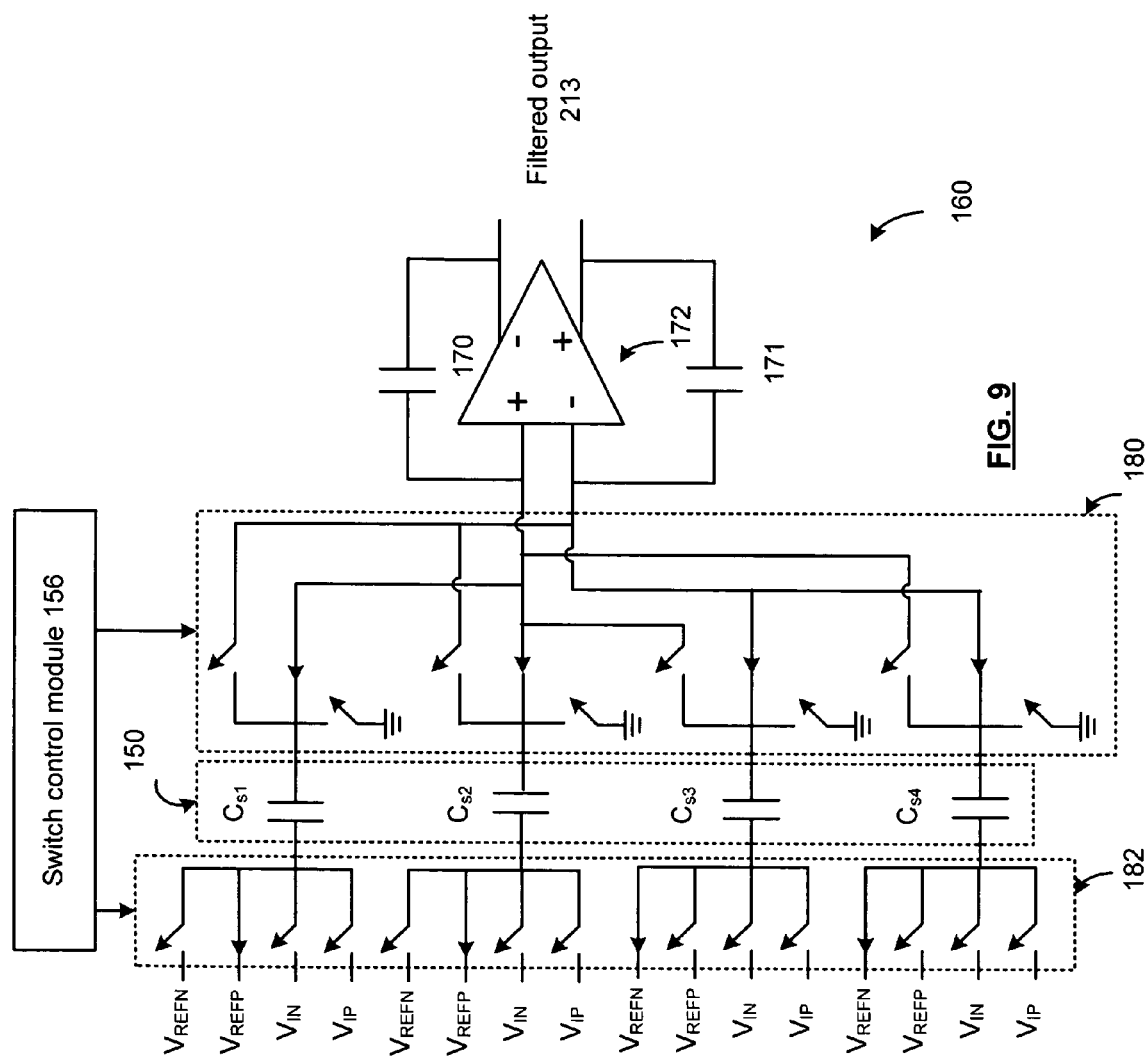
FIG. 9 presents a combination block diagram and schematic diagram representation of a fourth phase of operation of a controlled sample module in accordance with the present invention.

FIG. 9 presents a combination block diagram and schematic diagram representation of a fourth phase of operation of a controlled sample module in accordance with the present invention. During this phase, the switch control module 156 establishes a second integrate configuration of the switching network 152 wherein a configuration of at least one capacitor from the first plurality of sample capacitors and a configuration of at least one capacitor from the second plurality of sample capacitors are interchanged, as compared with the first integrate configuration. In the embodiment shown, the configuration of the second capacitor $C_{s2}$ is swapped with the configuration of the third capacitor $C_{s3}$.

In particular, the switch control module 156 configures the switching network 152 to couple the first end of the first capacitor $C_{s1}$ to the positive component of the reference signal and the second end of the first capacitor $C_{s1}$ to the amplifier 172, to couple the first end of the second capacitor $C_{s2}$ to the positive component of the reference signal and the second end of the second capacitor $C_{s2}$ to the amplifier 172, to couple the first end of the third capacitor $C_{s3}$ to the negative component of the reference signal and the second end of the third capacitor $C_{s3}$ to the amplifier 172, and to couple the first end of the fourth capacitor $C_{s4}$ to the negative component of the reference signal and the second end of the fourth capacitor $C_{s4}$ to the amplifier 172. In this fashion, a sampled difference between the input signal and the reference signal is coupled to the amplifier 172 for completion of the integration of this sampled value.

In one embodiment of the present invention, the method proceeds in the next phase in the first sample configuration. The charge remaining on the first capacitor $C_{s1}$ is equal and opposite to the charge remaining on the third capacitor $C_{s3}$, since in the prior phase, these two capacitors where coupled, respectively, to the positive and negative component of the reference signal. Likewise the charge remaining on the second capacitor $C_{s2}$ is equal and opposite to the charge remaining on the fourth capacitor $C_{s4}$. As these capacitors are coupled together at the beginning of the first sample phase, these charges cancel one another. This also substantially reduces the worst-case slew current on the input device, such as mixing module 332, that drives controlled sample module 160.

Figure 1:
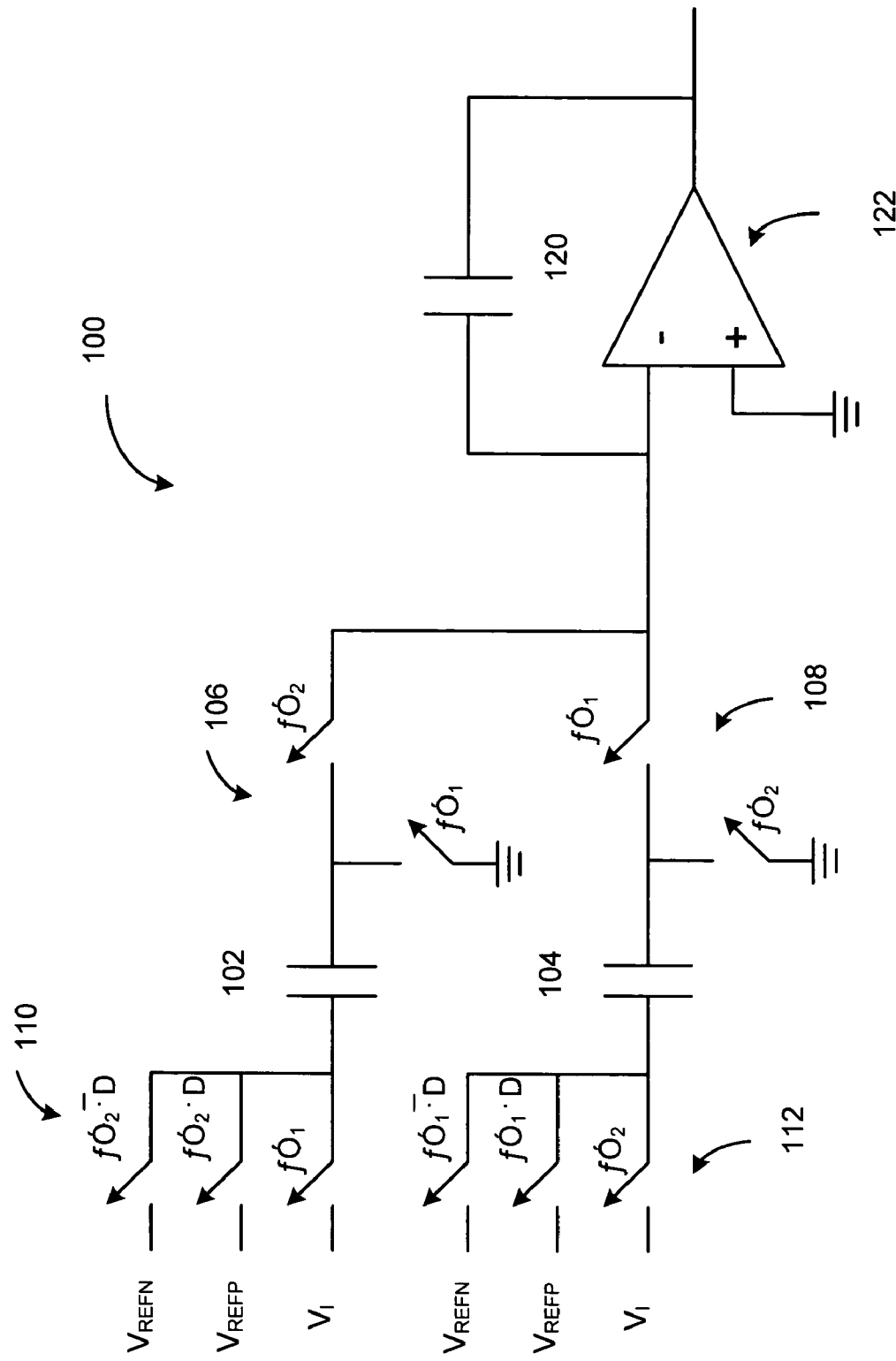
FIG. 1 presents a schematic representation of a prior art sampling module.

In additional configurations of the present invention, the next phases can proceed by swapping the configuration of the first capacitor $C_{s1}$ and the fourth capacitor $C_{s4}$. Further, when implemented as part of an analog to digital converter such as ADC module 340, the value of digital signal 206 that is fedback to DAC module 210 can be used to control the sampling as shown in FIG. 1. For example, for a first value of D, the capacitors that were coupled to $V_{IP}$ are coupled next to $V_{REFP}$ and the capacitors that were coupled to $V_{IN}$ are next coupled to $V_{REFN}$. For the other value of D, the capacitors that were coupled to $V_{IN}$ are coupled next to $V_{REFP}$ and the capacitors that were coupled to $V_{IP}$ are next coupled to $V_{REFN}$. Likewise, other more complex configurations are likewise possible within the broad scope of the present invention, as will be evident from the teachings presented herein The teachings of the present invention can be expanded to implement a correlated double sampling of the input signal and reference signal. As will be evident to one skilled in the art when presented the teachings presented herein, two staggered samples, taken by two controlled sampling modules 160 driven by clock signals with the appropriate phase offsets, can be employed to implement the correlated double sampling discussed above. In this configuration, two capacitors would connect to $V_{IN}$ and $V_{IP}$, and two capacitors would connect to $V_{REFP}$ and $V_{REFN}$ during each phase of operation.

Figure 10:
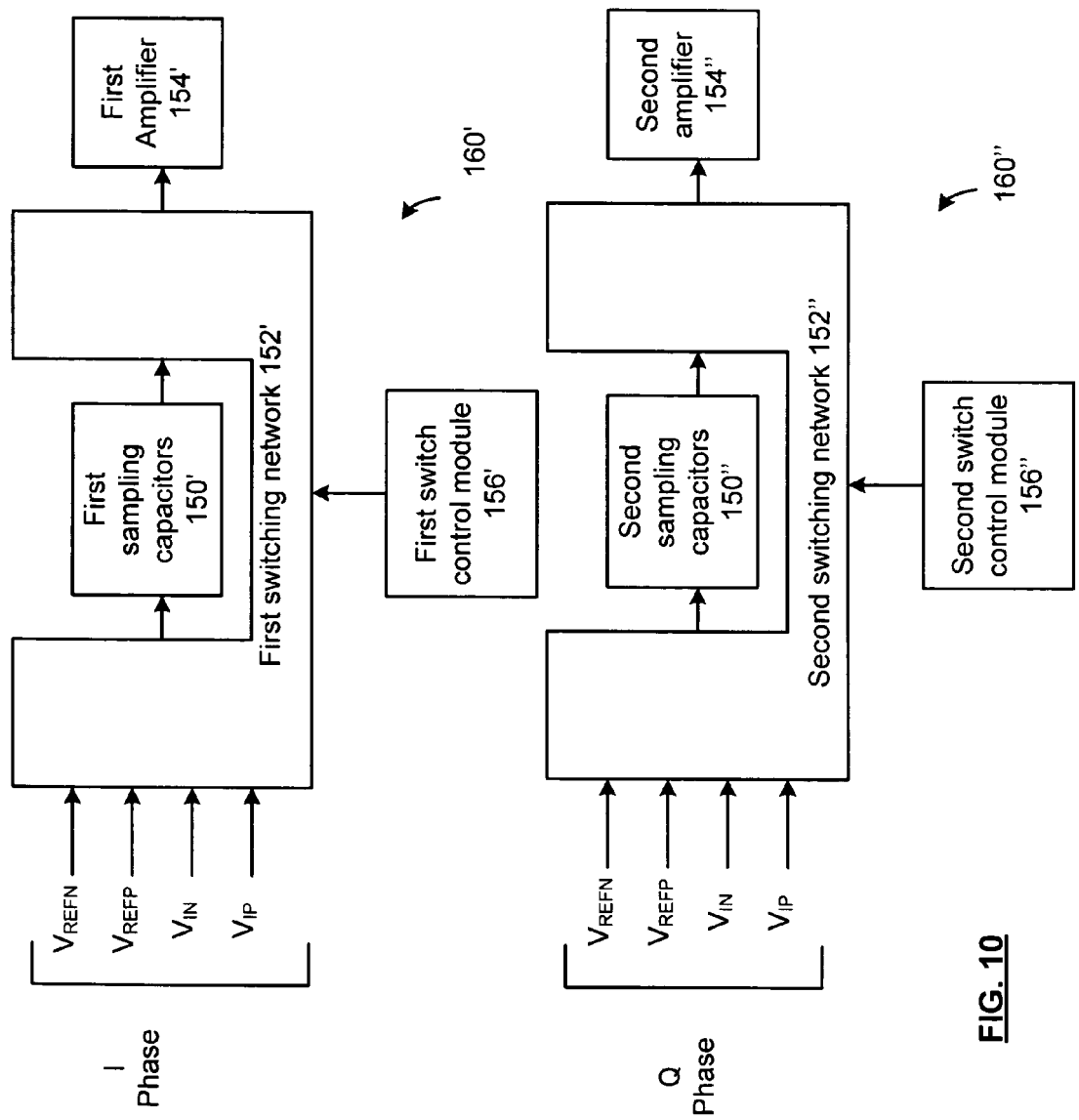
FIG. 10 presents a block diagram representation of a controlled sampling module in accordance with an embodiment of the present invention.

FIG. 10 presents a block diagram representation of a controlled sampling module in accordance with an embodiment of the present invention. In this embodiment of the present invention, the input signal and the reference signal each have an in-phase (I phase) component and a quadrature phase (Q phase) component. Controlled sampling module 160 includes a separate controlled sample modules 160' for processing the I phase input and reference signals and controlled sample module 160" for processing the Q phase input and reference signals. While $V_{REFP}$ and $V_{REFN}$ are shown separately for isolation, in an embodiment of the present invention, $V_{REFP}$ and $V_{REFN}$ can also be shared between the in-phase and quadrature phase portions of the circuit, if desired.

Figure 11:
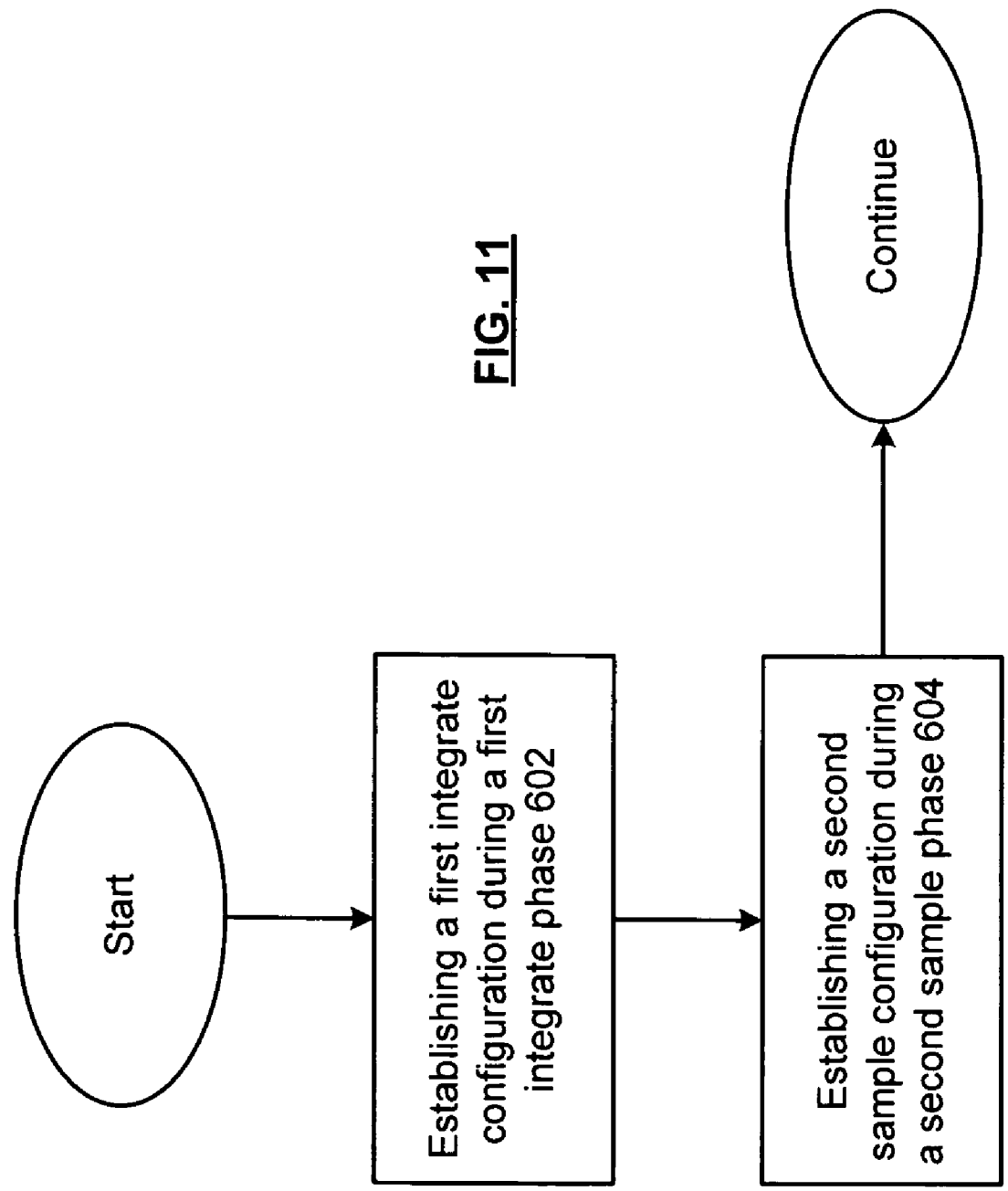
FIG. 11 presents a flowchart representation of a method in accordance with the present invention.

FIG. 11 presents a flowchart representation of a method in accordance with the present invention. A method for sampling an input signal from an input device is presented in accordance with the disclosure presented in conjunctions with FIGS. 2-10. The method begins in step 602 by establishing a first integrate configuration during a first integrate phase, so that a first end of each of the first plurality of sample capacitors is coupled to the positive component of the reference signal and a second end of each of the first plurality of sample capacitors is coupled to an amplifier, and a first end of each of the second plurality of capacitors is coupled to the negative component of the reference signal and a second end of each of the second plurality of sample capacitors is coupled to the amplifier. In step 604 a second sample configuration is established during a second sample phase, wherein a configuration of at least one capacitor from the first plurality of sample capacitors and a configuration of at least one capacitor from the second plurality of sample capacitors are interchanged, as compared with the first sample configuration. Further, a charge, remaining at an end of the first integrate phase, of the at least one capacitor from the first plurality of sample capacitors is cancelled by the second sample configuration.

In an embodiment of the present invention, a charge, remaining at the end of the first integrate phase, of the first plurality of sample capacitors is cancelled by the second sample configuration. In addition, a charge, remaining at the end of the first integrate phase, of the second plurality of sample capacitors is cancelled by the second sample configuration. Further, a worst-case slew current on the input device during the second sample phase is substantially reduced and/or minimized. As discussed in conjunction with FIGS. 2-10, the input signal can be a discrete time signal or a continuous time analog signal.

Figure 12:
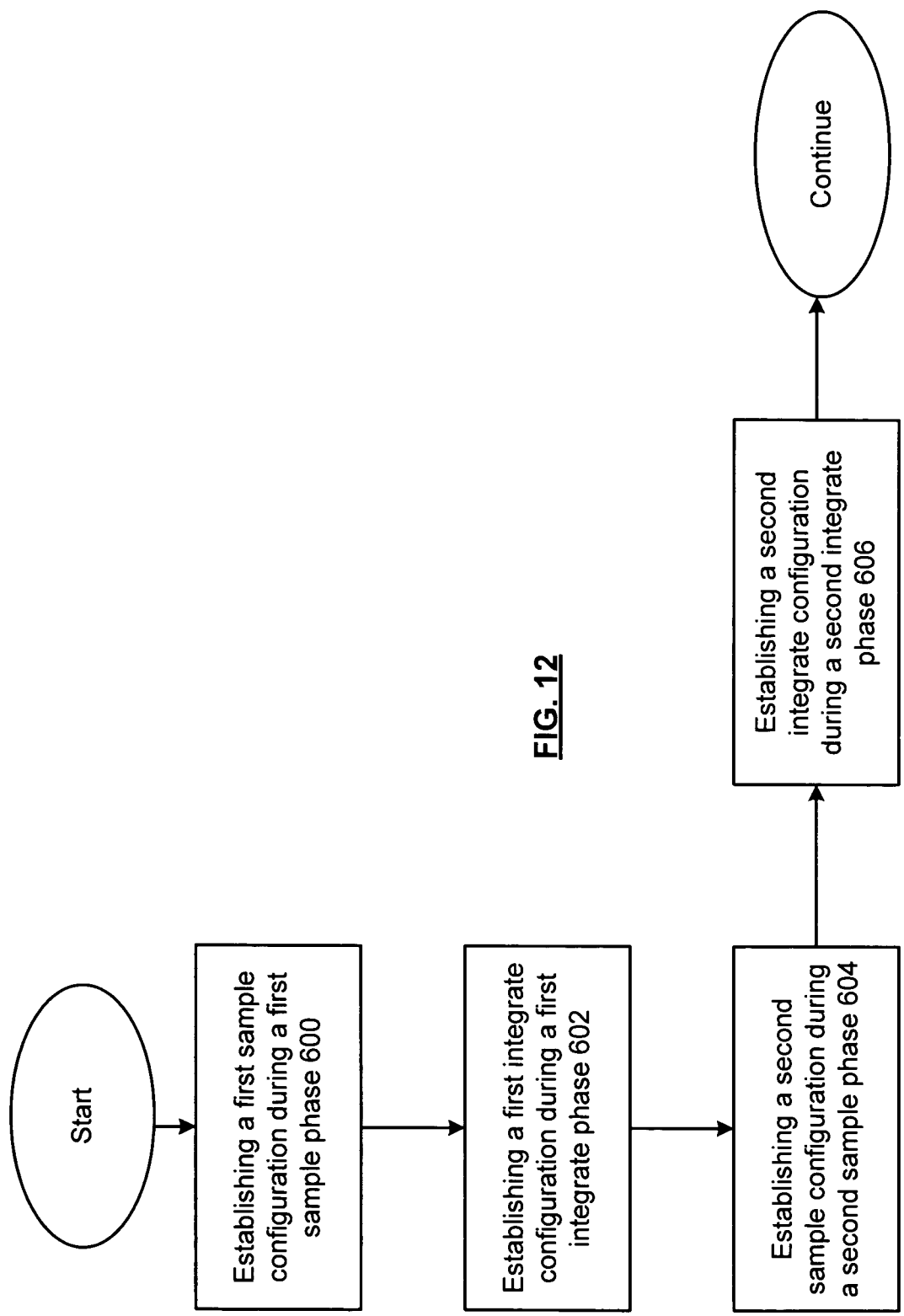
FIG. 12 presents a flowchart representation of a method is accordance with a further embodiment of the present invention.

FIG. 12 presents a flowchart representation of a method is accordance with a further embodiment of the present invention. This method includes the steps presented in accordance with FIG. 11. However, the method begins in step 600 by establishing a first sample configuration during a first sample phase, so that a first plurality of sample capacitors sample the positive component of the input signal, and a second plurality of capacitors sample the negative component of the input signal. The method further includes step 606 of establishing a second integrate configuration during a second integrate phase, wherein a configuration of at least one capacitor from the first plurality of sample capacitors and a configuration of at least one capacitor from the second plurality of sample capacitors are interchanged, as compared with the first integrate configuration. As discussed in conjunction with FIGS. 2-10, the first sample phase and the first integrate phase can be part of a correlated double sampling of the input signal.

Figure 13:
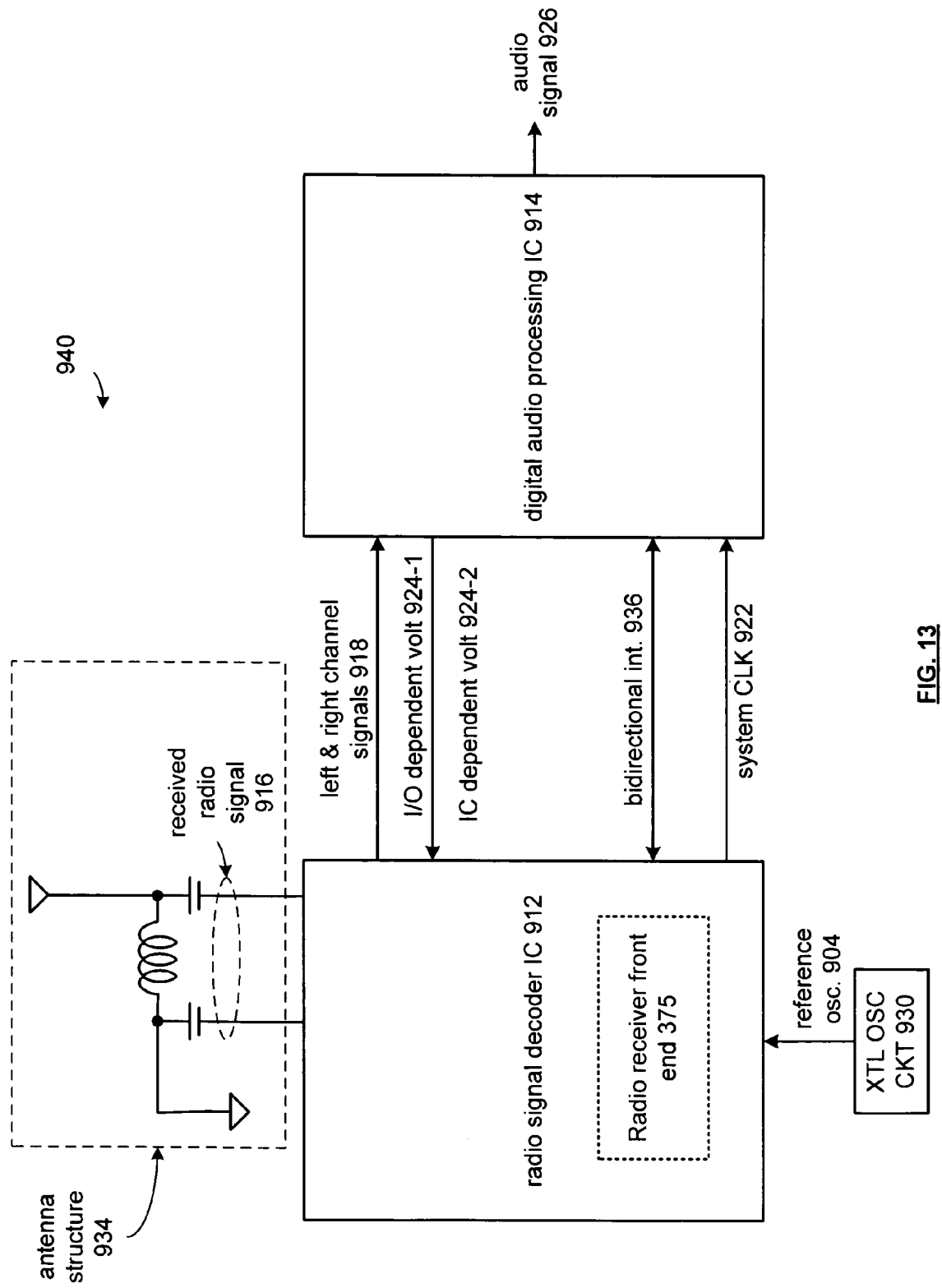
FIG. 13 presents a schematic block diagram of a handheld audio system in accordance with an embodiment of the present invention.

FIG. 13 presents a schematic block diagram of a handheld audio system in accordance with an embodiment of the present invention. In particular, handheld audio system 940 is presented that includes a radio signal decoder integrated circuit 912 that includes the radio receiver front end 375, ADC 340, controlled sample module 160 and/or corresponding methods in accordance with FIGS. 2-12, and a digital audio processing integrated circuit 914. In this embodiment, the radio signal decoder integrated circuit 912 is operably coupled to a crystal oscillator circuit 930 and an antenna structure 934. The crystal oscillation circuit 930 is operably coupled to a crystal and produces therefrom a reference oscillation 904.

The antenna structure 934 includes an antenna, a plurality of capacitors and an inductor coupled as shown. The received radio signal 916 is provided from the antenna structure 934 to the radio signal decoder integrated circuit 912. The radio signal decoder integrated circuit 912 converts the received radio signal 916 into left and right channel signals 918.

The digital audio processing integrated circuit 914, via a DC-DC converter, generates an input/output (I/O) dependent supply voltage 924-1 and an integrated circuit (IC) dependent voltage 924-2 that are supplied to the radio signal decoder IC 912. In one embodiment, the I/O dependent voltage 924-1 is dependent on the supply voltage required for input/output interfacing of the radio signal decoder IC and/or the digital audio processing IC 914 (e.g., 3.3 volts)

and the IC dependent voltage 924-2 is dependent on the IC process technology used to produce integrated circuits 912 and 914.

The interface between the integrated circuits 912 and 914 further includes a bi-directional interface 936. Such an interface may be a serial interface for the integrated circuits 912 and 914 to exchange control data and/or other type of data. In one embodiment, the bi-directional interface 936 may be one or more serial communication paths that are in accordance with the I²C serial transmission protocol. As one or ordinary skill in the art will appreciate, other serial transmission protocols may be used for the bi-directional interface 936 and the bi-directional interface 936 may include one or more serial transmission paths.

Figure 14:
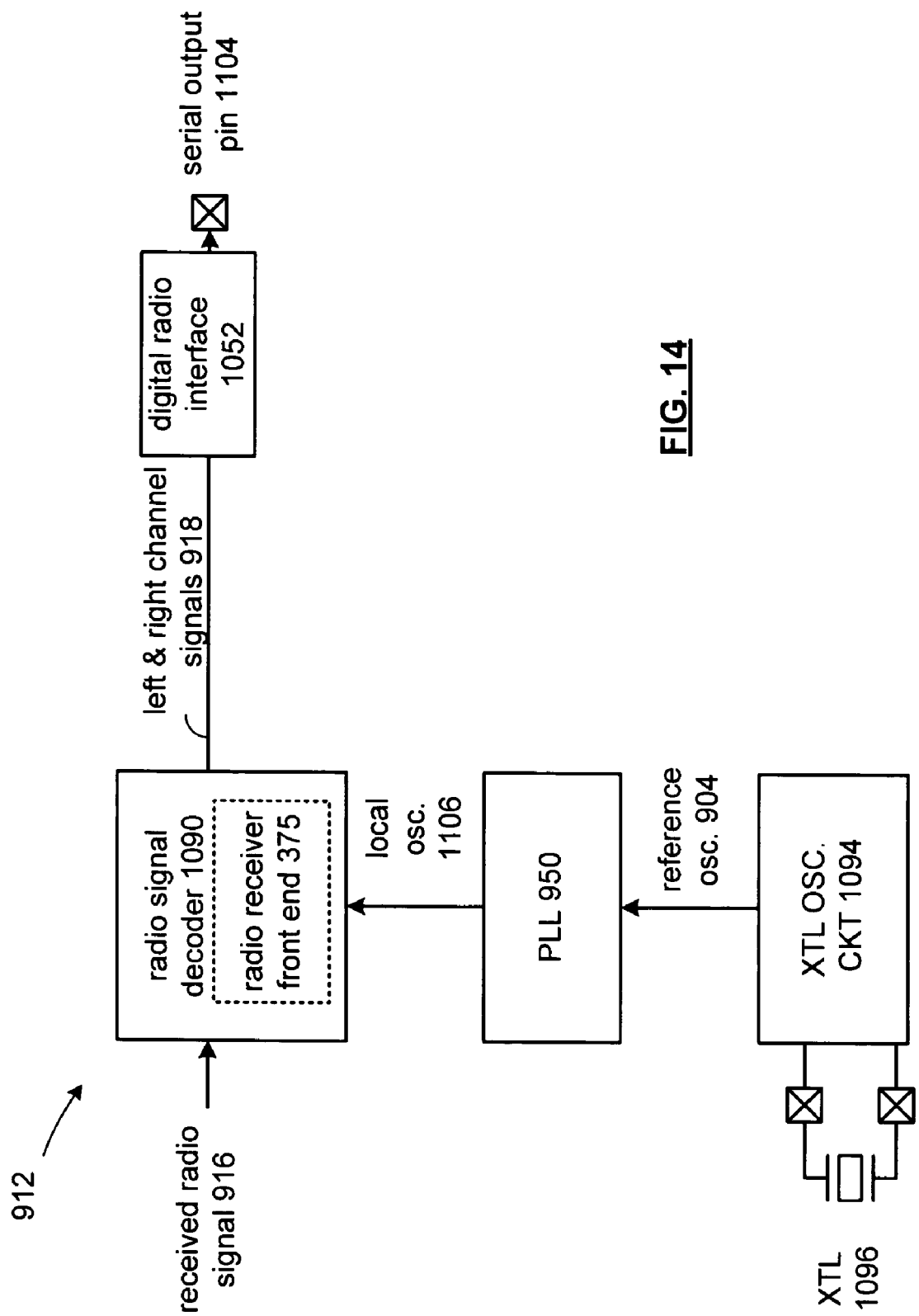
FIG. 14 presents a schematic block diagram of a radio signal decoder in accordance with an embodiment of the present invention.

FIG. 14 presents a schematic block diagram of a radio signal decoder in accordance with an embodiment of the present invention. In particular, an implementation of embodiment of the radio signal decoder integrated circuit 912 is presented that includes the digital radio interface 1052, a crystal oscillation circuit (XTL OSC CKT) 1094, a phase locked loop (PLL) 950 and a radio signal decoder 1090. Radio signal decoder 1090 includes the radio receiver front end 375, ADC 340, controlled sampling module 160 and/or corresponding methods in accordance with FIGS. 2-12. The crystal oscillation circuit 1094 is operably coupled, via integrated circuit pins, to an external crystal 1096 to produce a reference oscillation 904. The rate of the reference oscillation 904 is based on the properties of the external crystal 1096 and, as such, may range from a few kilo-Hertz to hundreds of mega-Hertz.

The phase locked loop 950 produces a local oscillation 1106 from the reference oscillation 904. The rate of the local oscillation corresponds to a difference between an intermediate frequency (IF) and a carrier frequency of the received radio signal 916. For instance, if the desired IF is 2 MHz and the carrier frequency of the received radio signal 916 is 101.5 MHz, the local oscillation is 99.5 MHz (i.e., 101.5 MHz-2 MHz). As one of ordinary skill in the art will appreciate, the intermediate frequency may range from DC to a few tens of MHz and the carrier frequency of the received radio signal 916 is dependent upon the particular type of radio signal (e.g., AM, FM, satellite, cable, etc.).

The radio signal decoder 1090 converts the received radio signal 916, which may be an AM radio signal, FM radio signal, satellite radio signal, cable radio signal, into the left and right channel signals 918 in accordance with the local oscillation 1106. The radio signal decoder 1090 provides the left and right channel signals to the digital radio interface 1052 for outputting via a serial output pin 1104. The serial output pin 1104 may include one or more serial input/output connections.

In preferred embodiments, the various circuit components are implemented using 0.35 micron or smaller CMOS technology. Provided however that other circuit technologies, both integrated or non-integrated, may be used within the broad scope of the present invention. Likewise, various embodiments described herein can also be implemented as software programs running on a computer processor. It should also be noted that the software implementations of the present invention can be stored on a tangible storage medium such as a magnetic or optical disk, read-only memory or random access memory and also be produced as an article of manufacture.

Thus, there has been described herein an apparatus and method, as well as several embodiments including a preferred embodiment, for implementing a controlled sampling module, an analog to digital converter and a radio receiver front end. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. A method for sampling an input signal from an input device, and a reference signal, the input signal having a positive component and a negative component and the reference signal having a positive component and a negative component, the method comprising the steps of:

establishing a first integrate configuration during a first integrate phase, so that a first end of each of a first plurality of sample capacitors is coupled to the positive component of the reference signal and a second end of each of the first plurality of sample capacitors is coupled to an amplifier, and a first end of each of a second plurality of capacitors is coupled to the negative component of the reference signal and a second end of each of the second plurality of sample capacitors is coupled to the amplifier; and establishing a first sample configuration during a first sample phase, wherein at least one capacitor from the first plurality of sample capacitors and at least one capacitor from the second plurality of sample capacitors are connected to a common component of the input signal;

wherein a charge, remaining at an end of the first integrate phase, of the at least one capacitor from the first plurality of sample capacitors is cancelled by the charge from the at least one capacitor from the second plurality of sample capacitors.

2. The method of claim 1 wherein a worst-case slew current on the input device during the second sample phase is substantially reduced.

3. The method of claim 1 wherein the input signal is a discrete time signal.

4. The method of claim 1 wherein the first sample phase and the first integrate phase are part of a correlated double sampling of the input signal.

5. The method of claim 1 wherein the first sample configuration and first integrate configuration are part of a sigma-delta analog to digital converter.

6. A controlled sampling module for sampling an input signal from an input device, and a reference signal, the input signal having a positive component and a negative component and the reference signal having a positive component and a negative component, the controlled sampling module comprising:

a first plurality of sample capacitors;

a second plurality of sample capacitors;

an amplifier;

a switching network, operably coupled to the first plurality of sample capacitors, the second plurality of sample capacitors, to the input signal, the reference signal, and the amplifier; and a switch control module, operably coupled to the switching network, wherein:

during a first sample phase, the switch control module establishes a first sample configuration of the switching network so that the first plurality of sample capacitors sample the positive component of the input signal, and the second plurality of capacitors sample the negative component of the input signal;

during a first integrate phase, the switch control module establishes a first integrate configuration of the switching network so that the first plurality of sample capacitors sample the positive component of the reference signal and are coupled to the amplifier, and the second plurality of capacitors sample the negative component of the reference signal and are coupled to the amplifier; and during a second sample phase, the switch control module establishes a second sample configuration of the switching network wherein a configuration of at least one capacitor from the first plurality of sample capacitors and a configuration of at least one capacitor from the second plurality of sample capacitors are interchanged, as compared with the first sample configuration;

wherein a charge, remaining at an end of the first integrate phase, of the at least one capacitor from the first plurality of sample capacitors is cancelled by the second sample configuration.

7. The controlled sampling module of claim 6 wherein a charge, remaining at the end of the first integrate phase, of the first plurality of sample capacitors is cancelled by the second sample configuration.

8. The controlled sampling module of claim 7 wherein a charge, remaining at the end of the first integrate phase, of the second plurality of sample capacitors is cancelled by the second sample configuration.

9. The controlled sampling module of claim 8 wherein:

during a second integrate phase, the switch control module establishes a second integrate configuration of the switching network wherein a configuration of at least one capacitor from the first plurality of sample capacitors and a configuration of at least one capacitor from the second plurality of sample capacitors are interchanged, as compared with the first integrate configuration.

10. The controlled sampling module of claim 8 wherein a worst-case slew current on the input device during the second sample phase is minimized.

11. The controlled sampling module of claim 8 wherein the input signal is a discrete time signal.

12. The controlled sampling module of claim 8 wherein the first sample phase and the second sample phase are part of a correlated double sampling of the input signal.

13. The controlled sample module of claim 8 wherein the first sample phase and the first integrate phase are part of a correlated double sampling of the input signal.

14. A controlled sampling module for sampling an input signal from an input device, and a reference signal, the input signal having a positive component and a negative component and the reference signal having a positive component and a negative component, controlled sampling module comprising:

a plurality of sample capacitors including a first capacitor, a second capacitor, a third capacitor, and a fourth capacitor;

an amplifier;

a switching network, operably coupled to the plurality of sample capacitors, to the input signal, the reference signal, the amplifier, and a ground reference signal; and a switch control module, operably coupled to the switching network, wherein:

during a first sample phase, the switch control module configures the switching network to couple a first end of the first capacitor to the positive component of the input signal and a second end of the first capacitor to the ground reference signal, to couple a first end of the third capacitor to the positive component of the input signal and a second end of the third capacitor to the ground reference signal, to couple a first end of the second capacitor to the negative component of the input signal and a second end of the second capacitor to the ground reference signal, and to couple a first end of the fourth capacitor to the negative component of the input signal and a second end of the fourth capacitor to the ground reference signal;

during a first integrate phase, the switch control module configures the switching network to couple the first end of the first capacitor to the positive component of the reference signal and the second end of the first capacitor to the amplifier, to couple the first end of the third capacitor to the positive component of the reference signal and the second end of the third capacitor to the amplifier, to couple the first end of the second capacitor to the negative component of the reference signal and the second end of the second capacitor to the amplifier, and to couple the first end of the fourth capacitor to the negative component of the reference signal and the second end of the fourth capacitor to the amplifier;

during a second sample phase, the switch control module configures the switching network to couple the first end of the first capacitor to the positive component of the input signal and the second end of the first capacitor to the ground reference signal, to couple the first end of the second capacitor to the positive component of the input signal and the second end of the second capacitor to the ground reference signal, to couple the first end of the third capacitor to the negative component of the input signal and the second end of the third capacitor to the ground reference signal, and to couple the first end of the fourth capacitor to the negative component of the input signal and the second end of the fourth capacitor to the ground reference signal; and during a second integrate phase, the switch control module configures the switching network to couple the first end of the first capacitor to the positive component of the reference signal and the second end of the first capacitor to the amplifier, to couple the first end of the second capacitor to the positive component of the reference signal and the second end of the second capacitor to the amplifier, to couple the first end of the third capacitor to the negative component of the reference signal and the second end of the third capacitor to the amplifier, and to couple the first end of the fourth capacitor to the negative component of the reference signal and the second end of the fourth capacitor to the amplifier.

15. The controlled sampling module of claim 14 wherein a worst-case slew current on the input device during the second sample phase is substantially reduced.

16. The controlled sampling module of claim 14 wherein the input signal is a discrete time signal.

17. The controlled sampling module of claim 14 wherein the first sample phase and the second sample phase are part of a correlated double sampling of the input signal.

18. The controlled sampling module of claim 14 further comprising at least one feedback capacitor, operably coupled to the amplifier, wherein the plurality of sample capacitors, the at least one feedback capacitor and the amplifier comprise an integrator module.

19. The controlled sample module of claim 14 wherein the first sample phase and the first integrate phase are part of a correlated double sampling of the input signal.

20. An analog to digital converter for creating a digital signal, based on an input signal from an input device, the input signal having a positive component and a negative component, the analog to digital converter comprising:
   a first plurality of sample capacitors;
   a second plurality of sample capacitors;
   an amplifier for generating an integrated signal;
   a digitizer, operably coupled to the integrated signal, for generating the digital signal;
   a digital to analog converter, operably coupled to the digital signal, for generating the reference signal, the reference signal having a positive component and a negative component;
   a switching network, operably coupled to the first plurality of sample capacitors, the second plurality of sample capacitors, to the input signal, the amplifier, and the reference signal; and
   a switch control module, operably coupled to the switching network, wherein:
      during a first sample phase, the switch control module establishes a first sample configuration of the switching network so that the first plurality of sample capacitors sample the positive component of the input signal, and the second plurality of capacitors sample the negative component of the input signal;
      during a first integrate phase, the switch control module establishes a first integrate configuration so that a first end of each of the first plurality of sample capacitors is coupled to the positive component of the reference signal and a second end of each of the first plurality of sample capacitors is coupled to an amplifier, and a first end of each of the second plurality of capacitors is coupled to the negative component of the reference signal and a second end of each of the second plurality of sample capacitors is coupled to the amplifier; and
      during a second sample phase, the switch control module establishes a second sample configuration of the switching network wherein a configuration of at least one capacitor from the first plurality of sample capacitors and a configuration of at least one capacitor from the second plurality of sample capacitors are interchanged, as compared with the first sample configuration;
      wherein a charge, remaining at an end of the first integrate phase, of the at least one capacitor from the first plurality of sample capacitors is cancelled by the second sample configuration.

21. The analog to digital converter of claim 20 wherein a charge, remaining at the end of the first integrate phase, of the first plurality of sample capacitors is cancelled by the second sample configuration.

22. The analog to digital converter of claim 21 wherein a charge, remaining at the end of the first integrate phase, of the second plurality of sample capacitors is cancelled by the second sample configuration.

23. The analog to digital converter of claim 20 wherein:
   during a second integrate phase, the switch control module establishes a second integrate configuration of the switching network wherein a configuration of at least one capacitor from the first plurality of sample capacitors and a configuration of at least one capacitor from the second plurality of sample capacitors are interchanged, as compared with the first integrate configuration.

24. The analog to digital converter of claim 20 wherein a worst-case slew current on the input device during the second sample phase is substantially reduced.

25. The analog to digital converter of claim 20 wherein the input signal is a discrete time signal.

26. The analog to digital converter of claim 20 wherein the first sample phase and the second sample phase are part of a correlated double sampling of the input signal.

27. The analog to digital converter of claim 20 that is a part of a multi-stage noise shaping (MASH) architecture.

28. The analog to digital converter of claim 20 wherein the first sample phase and the first integrate phase are part of a correlated double sampling of the input signal.

29. A radio receiver front end for receiving a received radio signal having a plurality of channel signals, each of the plurality of channel signals being modulated at one of a corresponding plurality of carrier frequencies, and for converting a selected one of the plurality of channel signals into a digital signal, the radio receiver front end comprising:
   a low noise amplifier, operatively coupled to the received radio signal for producing an amplified radio signal;
   a channel selector, for producing a control signal that corresponds to a selected one of the plurality of channels;
   a local oscillator, operatively coupled to a reference oscillation, for producing a local oscillation signal at a local oscillation frequency, the local oscillation frequency based on the control signal;
   a mixing module, for mixing the amplified radio signal and the local oscillation signal to form an input signal;
   a first plurality of sample capacitors;
   a second plurality of sample capacitors;
   an amplifier for generating an integrated signal;
   a digitizer, operably coupled to the integrated signal, for generating the digital signal;
   a digital to analog converter, operably coupled to the digital signal, for generating the reference signal, the reference signal having a positive component and a negative component;
   a switching network, operably coupled to the first plurality of sample capacitors, the second plurality of sample capacitors, to the input signal, the amplifier, and the reference signal; and
   a switch control module, operably coupled to the switching network, wherein:
      during a first sample phase, the switch control module establishes a first sample configuration of the switching network so that the first plurality of sample capacitors sample the positive component of the input signal, and the second plurality of capacitors sample the negative component of the input signal;
      during a first integrate phase, the switch control module establishes a first integrate configuration so that a first end of each of the first plurality of sample capacitors is coupled to the positive component of the reference signal and a second end of each of the first plurality of sample capacitors is coupled to an amplifier, and a first end of each of the second plurality of capacitors is coupled to the negative component of the reference signal and a second end of each of the second plurality of sample capacitors is coupled to the amplifier; and during a second sample phase, the switch control module establishes a second sample configuration of the switching network wherein a configuration of at least one capacitor from the first plurality of sample capacitors and a configuration of at least one capacitor from the second plurality of sample capacitors are interchanged, as compared with the first sample configuration;

wherein a charge, remaining at an end of the first integrate phase, of the at least one capacitor from the first plurality of sample capacitors is cancelled by the second sample configuration.

30. The radio receiver front end of claim 29 wherein a charge, remaining at the end of the first integrate phase, of the first plurality of sample capacitors is cancelled by the second sample configuration.

31. The radio receiver front end of claim 30 wherein a charge, remaining at the end of the first integrate phase, of the second plurality of sample capacitors is cancelled by the second sample configuration.

32. The radio receiver front end of claim 29 wherein:

during a second integrate phase, the switch control module establishes a second integrate configuration of the switching network wherein a configuration of at least one capacitor from the first plurality of sample capacitors and a configuration of at least one capacitor from the second plurality of sample capacitors are interchanged, as compared with the first integrate configuration.

33. The radio receiver front end of claim 29 wherein a worst-case slew current on the input device during the second sample phase is substantially reduced.

34. The radio receiver front end of claim 29 wherein the input signal is a discrete time signal.

35. The radio receiver front end of claim 29 wherein the first sample phase and the second sample phase are part of a correlated double sampling of the input signal.

* * * * *